(12) United States Patent
Tannas, Jr.

(10) Patent No.: US 8,259,282 B2
(45) Date of Patent: Sep. 4, 2012

(54) METHOD OF REPAIRING SHORT OR POTENTIAL SHORT CIRCUITS DURING RESIZING OF AN ELECTRONIC FLAT PANEL DISPLAY

(76) Inventor: Lawrence E. Tannas, Jr., Orange, CA (US)

(*) Notice: Subject to any disclaimer, the term of this patent is extended or adjusted under 35 U.S.C. 154(b) by 176 days.

(21) Appl. No.: 12/781,624

(22) Filed: May 17, 2010

(65) Prior Publication Data

US 2011/0281489 A1    Nov. 17, 2011

(51) Int. Cl.
  *G02F 1/13* (2006.01)
  *G02F 1/1339* (2006.01)
(52) U.S. Cl. .................................. 349/192; 349/153
(58) Field of Classification Search ............. 349/153, 349/192
  See application file for complete search history.

(56) References Cited

U.S. PATENT DOCUMENTS

| | | | |
|---|---|---|---|
| 4,275,494 A | 6/1981 | Kohyama et al. | |
| 4,743,099 A | 5/1988 | Dickerson et al. | |
| 5,164,565 A | 11/1992 | Addiego et al. | |
| 5,169,693 A | 12/1992 | Fujimura | |
| 5,278,685 A | 1/1994 | Iwamoto et al. | |
| 5,610,742 A | 3/1997 | Hinata et al. | |
| 5,757,456 A | 5/1998 | Yamazaki et al. | |
| 5,781,258 A | 7/1998 | Dabral et al. | |
| 5,808,719 A | 9/1998 | Fujiwara et al. | |
| 5,812,226 A | 9/1998 | Izumi et al. | |
| 5,851,411 A | 12/1998 | An et al. | |
| 5,929,961 A | 7/1999 | Nishi et al. | |
| 6,099,672 A | 8/2000 | Yamazaki et al. | |
| 6,137,559 A | 10/2000 | Tanaka et al. | |
| 6,191,840 B1 | 2/2001 | Bon | |
| 6,204,906 B1 | 3/2001 | Tannas | |
| 6,236,446 B1 | 5/2001 | Izumi et al. | |
| 6,476,415 B1 | 11/2002 | Walker et al. | |
| 6,509,949 B1 | 1/2003 | Lu et al. | |
| 7,256,862 B2 | 8/2007 | Chen et al. | |

(Continued)

FOREIGN PATENT DOCUMENTS

EP    0556855    8/1993

(Continued)

OTHER PUBLICATIONS

PCT International Search Report and Written Opinion for PCT/US2011/031989, Applicant: Lawrence E. Tannas, Jr., Forms PCT/ISA/210, PCT/ISA/220 and PCT/ISA/237, dated Nov. 28, 2011, 10 pages.

*Primary Examiner* — Richard Kim
*Assistant Examiner* — David Chung
(74) *Attorney, Agent, or Firm* — Vista IP Law Group LLP; William A. English

(57) ABSTRACT

Electronic flat panel displays (FPDs) including liquid crystal displays (LCDs) may be resized to meet custom size requirements for applications in aerospace and elsewhere. During the resizing process, pixel line defects may occur in the image due to electrical short circuits at the resized cut edge. Methods for repairing such short circuits are described, including use of mechanical, electrical, chemical, thermal, and/or other means, and any combination thereof, to open the short circuits. The method may be applied to the sealed cut edge to ruggedize the seal, even if image defects are not exhibited initially. The repaired short circuits may be stress tested to ensure the defects will not recur during the life of the display, and the repaired areas may be resealed.

32 Claims, 4 Drawing Sheets

U.S. PATENT DOCUMENTS

| | | |
|---|---|---|
| 7,595,857 B2 | 9/2009 | Yang et al. |
| 7,780,492 B2 | 8/2010 | Tannas |
| 7,938,051 B2 | 5/2011 | Tannas |
| 2002/0018175 A1* | 2/2002 | Hong et al. ............ 349/192 |
| 2002/0033926 A1 | 3/2002 | Nakahara et al. |
| 2002/0044253 A1 | 4/2002 | Masuda et al. |
| 2003/0184706 A1 | 10/2003 | Watson |
| 2004/0074366 A1 | 4/2004 | Choo et al. |
| 2005/0001974 A1 | 1/2005 | Iida et al. |
| 2005/0056127 A1 | 3/2005 | Yamabuchi et al. |

FOREIGN PATENT DOCUMENTS

| | | |
|---|---|---|
| GB | 2183073 | 5/1987 |
| GB | 2330423 | 4/1999 |
| GB | 2381080 | 4/2003 |
| JP | 55026516 | 8/1978 |
| JP | 55084918 | 6/1980 |
| JP | 57099615 | 6/1982 |
| JP | 59017532 | 1/1984 |
| JP | 60146228 | 8/1985 |
| JP | 61186941 | 8/1986 |
| JP | 61210326 | 9/1986 |
| JP | 61215524 | 9/1986 |
| JP | 2235026 | 9/1990 |
| JP | 3293633 | 12/1991 |
| JP | 5-045617 | 2/1993 |
| JP | 6-130403 | 5/1994 |
| JP | 08076074 | 3/1996 |
| JP | 08122769 | 5/1996 |
| JP | 08146444 | 6/1996 |
| JP | 9197416 | 7/1997 |
| WO | 9919765 | 4/1999 |
| WO | 03040049 | 5/2003 |

* cited by examiner

METHOD OF REPAIRING SHORT OR POTENTIAL SHORT CIRCUITS DURING RESIZING OF AN ELECTRONIC FLAT PANEL DISPLAY

FIELD OF THE INVENTION

The present invention relates to the field of resizing Liquid Crystal Displays (LCDs) and similar electronic Flat Panel Displays (FPDs). More specifically, the present invention relates to the repair and prevention of electrical shorts that may occur because of the resizing process.

BACKGROUND

Electronic displays are commonly used to portray data in the form of visual information to be acted upon by the user. The information is typically derived from a computer and used interactively to conduct data and word processing, advertising signage, as aerospace instruments, to fly airplanes, to control machines, etc. Today, LCDs are the leading technology for such displays. LCDs are electronic FPDs that have great industrial utility. Methods for resizing FPDs are described in U.S. Pat. No. 7,535,547, titled "Customized Electronic Display and Methods of Customizing the Physical Size and/or Shape Thereof," which is hereby incorporated herein by reference in its entirety.

To more easily understand the nature of the problem addressed by the present invention, a brief description of the structure and operation of an LCD as an example of an FPD and of resizing an LCD follows. For a more detailed description, the reader is referred to the above-referenced U.S. Pat. No. 7,535,547.

An LCD is made from two substrates (20) of transparent material, typically glass among other things, with a thin film of liquid crystal material sealed between the two substrates (20). Spacers may be placed in between the substrates (20) in a precise manner, thus forming a uniformly spaced cell. The cell is sealed with a perimeter seal (25). A simplified schematic of a typical LCD panel is shown in FIGS. 1a and 1b of the above-referenced U.S. Pat. No. 7,535,547. The display's active area is defined by electrodes on the inside of the substrate in the cell area organized to address picture elements (pixels). There are many pixels electrically stimulated (controlled) to create images. Each pixel is controlled by electrodes (30) that continue outside of the seal area to the edge of the substrate(s) (20). The electrodes (30) are connected to external electronics that in turn are connected to a computer or similar electrical stimulus. A pixel is formed at each intersection of a row and column line and there may be other electrical components at the intersection such as thin film transistors (TFTs) and capacitors and other conducting lines such as ground potential lines. Typically, the electrodes (30) are thin film metal conductors organized in lines of rows and columns with hundreds of row and column electrodes running the full length and width of the substrate(s) (20), wherein one row electrode line and one column electrode line are associated with each pixel in a matrix-like organization. Typically, in an active type LCD, all of the row and column electrodes (30) are on the inside surface of one of the substrates (20), and a common ground plane (35) is on the inside surface of the opposing substrate. The liquid crystal material and spacers are in between the electrodes (30) and the ground plane (35). All of the row, column and ground plane electrodes are insulated from one another except at unique points to facilitate the operation of the display. The liquid crystal film, spacers, substrates and the sealant enclosing the cell, are all dielectrics.

When a display is resized, the cell is cut through the substrate, thus transitioning the image display area, perimeter seal and all of the electrodes at the cut edge (55). The LCD is then cut and completely separated into a target portion (5) and a waste portion (not shown). When this occurs, all of the thin film electrodes (30) may not separate exactly along the cut edge (55). In other words, the conductor lines (30) and the ground plane (35) are disturbed by the resizing process, thus possibly causing undesired electrical contact in some manner. In the simplest example, some electrodes (30) may tear loose from the substrate (20) at the cut edge (55) and make physical contact with each other or with the ground plane (35), thus causing an undesirable electrical short circuit. Examples of conductor lines (30) shorting to the ground plane (35) are shown in FIG. 1, labeled specifically as 30-s1 (representing a line that became dislodged from the substrate) and 30-s2 (representing a line that became bent). Application of the resizing sealant (45) and the inevitable fluid motion may cause additional shorts. The exact detail of how the short circuits occur is not significant, as any short at the cut line will adversely affect the image area (40) of the display. The electrodes in question may be very close such that they may short at a later time due to contamination or motion at the location in question.

Such electrical shorts may undesirably be cemented and bound together when the cell is resealed. In that case, when the LCD is tested, the pixels connected to the shorted row or column line(s) (30) will not respond properly to the image signal and will act as if the pixels associated with the shorted electrode have failed. Typically, this means the image would appear to have a line of failed pixels as a result of a shorted conductor line extending from the point of the short circuit along the shorted line into the image area (40). An example showing the location of an image failure resulting from a shorted conductor line (30-s1) is shown symbolically as a row of x's (50) in FIG. 2. Multiple shorted lines may exist simultaneously. The failed pixels may only extend a short distance from the cut edge in the case of very weak shorts. Or not at all because the short is so weak or not quite complete such that its effect or potential effect is not ramified in the image. Many types of shorts can occur in many ways or at different times. The exact nature of the short or details of the short are not critical, since in such cases the resized target display would be defective unless the resized image area was restored to eliminate the resulting failed pixels in the image that was caused by the short or belated short at the cut edge (55).

There is thus a desire for a method to remove the short or shorts caused by the resizing process, and to restore the failed pixels in the image of a resized FPD caused by the shorted electrical line(s) at the cut edge. Further, it is recommended to perform steps to ensure the short or shorts or belated shorts are permanently removed and do not reoccur during the operational life of the resized display.

The methods described herein may be applied to FPDs other than LCDs, such as Organic Light Emitting Diode displays, electrophoretic displays, electroluminescent displays, etc.

The shorted electrodes via the pixel arrangement as dictated by the electrode arrangement affect the image. Typically when a short does occur the pixels and electrodes are in a straight line as discussed in the example herein. However, that is not always the case.

SUMMARY OF THE INVENTION

When the target portion (5) of an FPD (typically an LCD) is cut and separated from the waste portion during a resizing process, the cutting, breaking and separation of the substrate (20) has a physical effect along the cut edge (55) that could lead to short circuits along the cut edge (55). For example, the conductor lines (30) may separate from the substrate(s) (20). Further, the conductor lines (30) may contact the ground plane (35) (as represented by 30-s1 and 30-s2) or each other and cause undesirable short circuits. In these cases, the electrical signal for the display image is short circuited, thus inhibiting a proper signal to the pixels.

The objective of the present invention is to repair these electrical shorts that may occur during the process of resizing an LCD or similar FPD. Further, the objective is to remove potential future shorts because of the proximity of the cut electrodes. The repair is the act of physically reducing the electrode ends to the extent necessary to stop and prevent shorts which cause pixel failures in the image. It is a further objective to enhance the removal of the short or near shorts so that it does not reoccur during the operating life of the resized display. Additionally, a stress test is used to ensure the adequacy of the removed short. This is accomplished by using any one or more of mechanical, electrical, chemical, and/or thermal means, used alone, sequentially and/or substantially simultaneously. As part of the repair process, the repaired area(s) are stress tested to ensure that the shorts are sufficiently opened and the conductors are sufficiently separated that they do not occur or recur during the life of the resized display. Further, the cut line area of the resized display may be stress tested to ensure any marginal short or condition will not occur as a short and image defect at a later time during the life of the display. Also, as part of the repair process, it may be necessary to grind away the seal area to remove the short and thus restore the image. In such cases, any depleted resizing seal (45) may be replenished, and if so, the display may again be stress tested thereafter.

The state of the art in the industry of resizing FPDs is to use simple mechanical means to remove shorts. An example of using mechanical means is to mechanically scratch or grind at the location on the cut edge of the short circuit until the symptoms of pixel failures in the image go away. A short is sometimes so weak that simply scratching the point of the short will eliminate it, and this would be indicated by the disappearance of the failed line of pixels (50) in the image. However, the separation of the shorting electrodes is unknown and may be minimal. The short can reappear from minor contamination or mechanical provocation. Further, a near short is not typically attended to as its existence is not known. The mechanical means is undiscerning and its use may inadvertently actually cause more near shorts. A near short is where the electrodes are very close to touching such that a future event during the life of the display may cause them to short and cause pixel failures.

An example of using electrical means is to apply an excess electrical voltage to the suspect electrodes (30). Typically, the shorts have a higher resistivity than the conductor lines (30). When a high d.c. or a.c. voltage of approximately ten times the nominal voltage is applied between two lines (30) and/or between a line (30) and the ground plane (35) as applicable, the shorts open like a fuse in an electrical circuit. The voltage may be applied to the ground plane (35) as the display is displaying an image. The voltage can be gradually increased until the short fuses open. The shorting electrode would be significantly separated because of the magnitude of the electrical voltage and subsequent burning of the electrode.

An example of using a chemical means is to apply an etching chemical along the cut edge (55) to remove the short circuit and other exposed circuit electrodes in the proximity of the cut edge. Since the conductive lines (30) are typically made of thin film metals, they can be etched back from the cut substrate edge (55) to the point where they are no longer in contact with each other, and this would be apparent by the disappearance of the line of failed pixels (50) in the image. The etching could continue beyond the point of merely opening the short, to increase the separation distance between the circuit electrodes in proximity of the cut edge, e.g., the offending electrodes. The chemical etchant will react with the electrode and turn it into a dielectric. Thus, the electrodes are separated and isolated more than could be accomplished by mechanical means alone. The mechanical method only moves the offending electrodes apart. The chemical etching actually destroys the conductive properties of all the exposed electrodes by altering their chemical formulation and electrical properties and turning them into dielectrics.

An example of using a thermal means is to heat the local area of the short with a soldering iron or laser beam to thermally melt the electrodes within the adhesive and/or glass until the short symptoms are removed. The melting of the electrodes would insure an area of destruction at the location of the short. This would insure a wider separation of the offending electrodes than simple mechanical scratching.

DETAILED DESCRIPTION

The reader is again referred to the above-referenced U.S. Pat. No. 7,535,547 if necessary for a more detailed description of the process of resizing LCDs. The present invention is directed to the repair of electrical short circuit that may occur during such resizing processes at the resizing cut edge of the target portion (5) of the FPD.

Figure 1:
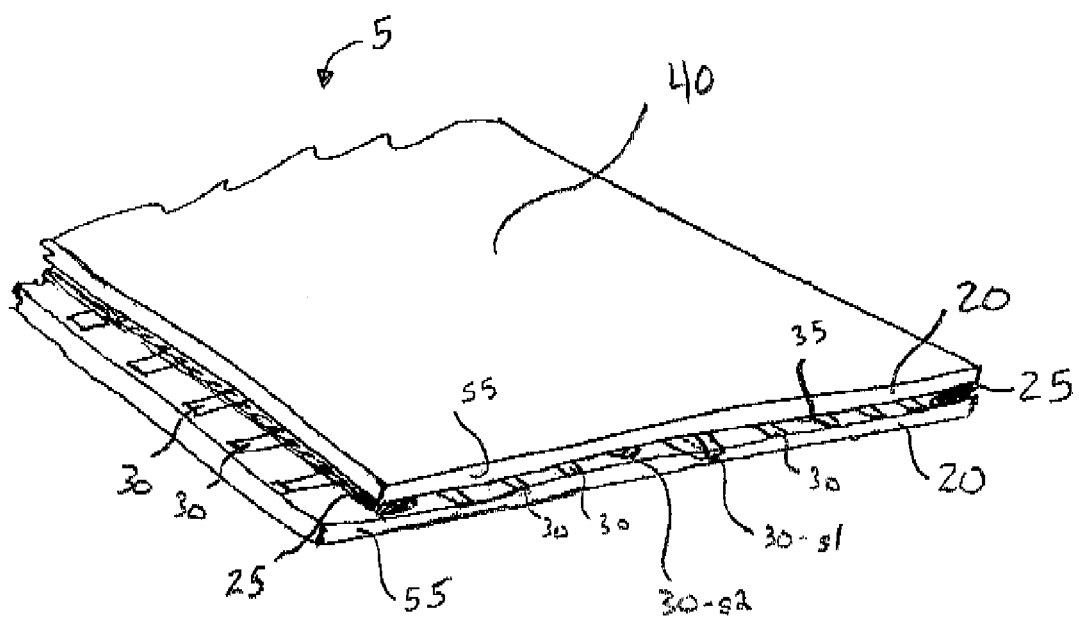
FIG. 1 is a perspective view of the cut edge (55) of the target portion (5) of a resized LCD, before it is resealed, showing two lines (130-s1 and 130-s2) shorted to the ground plane (35). This is an example of the circuitry of the active matrix type of LCD. Other circuit elements that could contribute to the short circuit such as transistors, capacitors, etc. are not shown for simplicity.

Turning first to FIG. 1, a perspective view is shown of the cut edge (55) of the target portion (5) of a resized LCD with substrates (20), image area (40), and original LCD seal (25) intact on the non-cut edges of the target portion (5). This represents the LCD after it has been cut as part of the resizing process, and thus the cut edge (55) has not yet been resealed. The edge of the cell is exhibited showing electrical conductor lines (30) and location of the ground plane (35). Two of the lines (30-s1 and 30-s2) are shown shorted to the ground plane (35). The display is not showing an image in this Figure. If it was, the shorts would cause a line in the image due to the inability of the shorted line to control the corresponding pixels connected to it. The left edge in the perspective drawing is one of the edges where the external electronics are attached to control the pixels and show an image. The description of how the image is portrayed is not relevant to this invention. The cut edge (55) in some cases could be coincident with one of the conductor lines (30) on the left edge, which would further complicate the nature of potential shorts along the cut edge (55). For example, the shorts could potentially be so extensive that a narrow sliver of the substrate panel needs to be removed. This might occur when the cut edge (55) is on top of a conductor line (30) running parallel to the cut edge (55). In such situations, after the sliver is removed, the repair process should be repeated from the beginning.

The shorted line (30-$s1$) is an example of a conductor line (30) that has separated from the substrate (20) of target portion (5) sufficiently to bridge the cell gap and make contact with the ground plane (35). Shorted line (30-$s2$) is an example of a conductor line (30) that has separated from the waste portion in sufficient length to fold back and bridge the cell gap to make contact with the ground plane (35). Shorted lines may occur in these manners, or in other manners. These shorted lines (30-$s1$ and 30-$s2$) are examples of the simplest form of the short-circuits to be repaired in accordance with the present invention.

Figure 2:
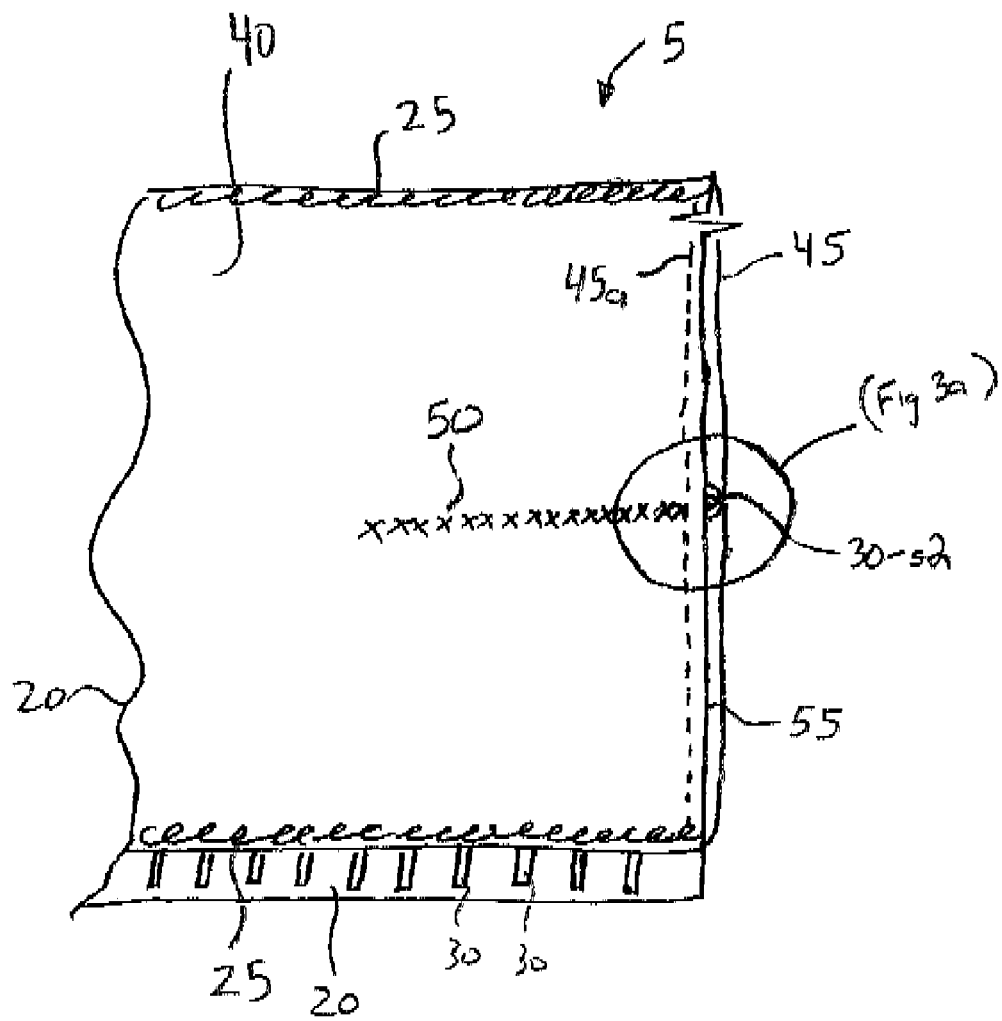
FIG. 2 is a plan view of the LCD in FIG. 1, after it has been resealed, showing a shorted conductor line (30-s2), and symbolically showing (at 50) the symptoms of a line in the image of pixels failing to respond to the image signal associated with the shorted conductor line at the cut edge.

As part of the resizing process, the cut edge (55) is resealed. FIG. 2 is a plan view of the LCD in FIG. 1, after the LCD has been resealed along the cut edge (55) with resizing seal (45). The shorted conductor line (30-$s2$) is still undesirably present. Resizing seal (45) is shown penetrating in between the substrates (20) as indicated by dotted line (45$a$). The symptoms of the failed pixels associated with the shorted conductor line (30-$s1$) are symbolically shown as x's (50). The x's (50) represent a line of pixels or a portion of a line of pixels missing in the image emanating from the cut edge. The original perimeter seal (25) is shown along the non-cut edges for reference. The image shown in FIG. 2 is a solid color with a line or partial line (50) not responding to the image commanded. The means for generating an image are not included in FIG. 2, but would require electrical connections to the electrical conductors (30) shown in the bottom of the Figure. Methods of repairing these short circuits will now be described in more detail.

Figure 4:
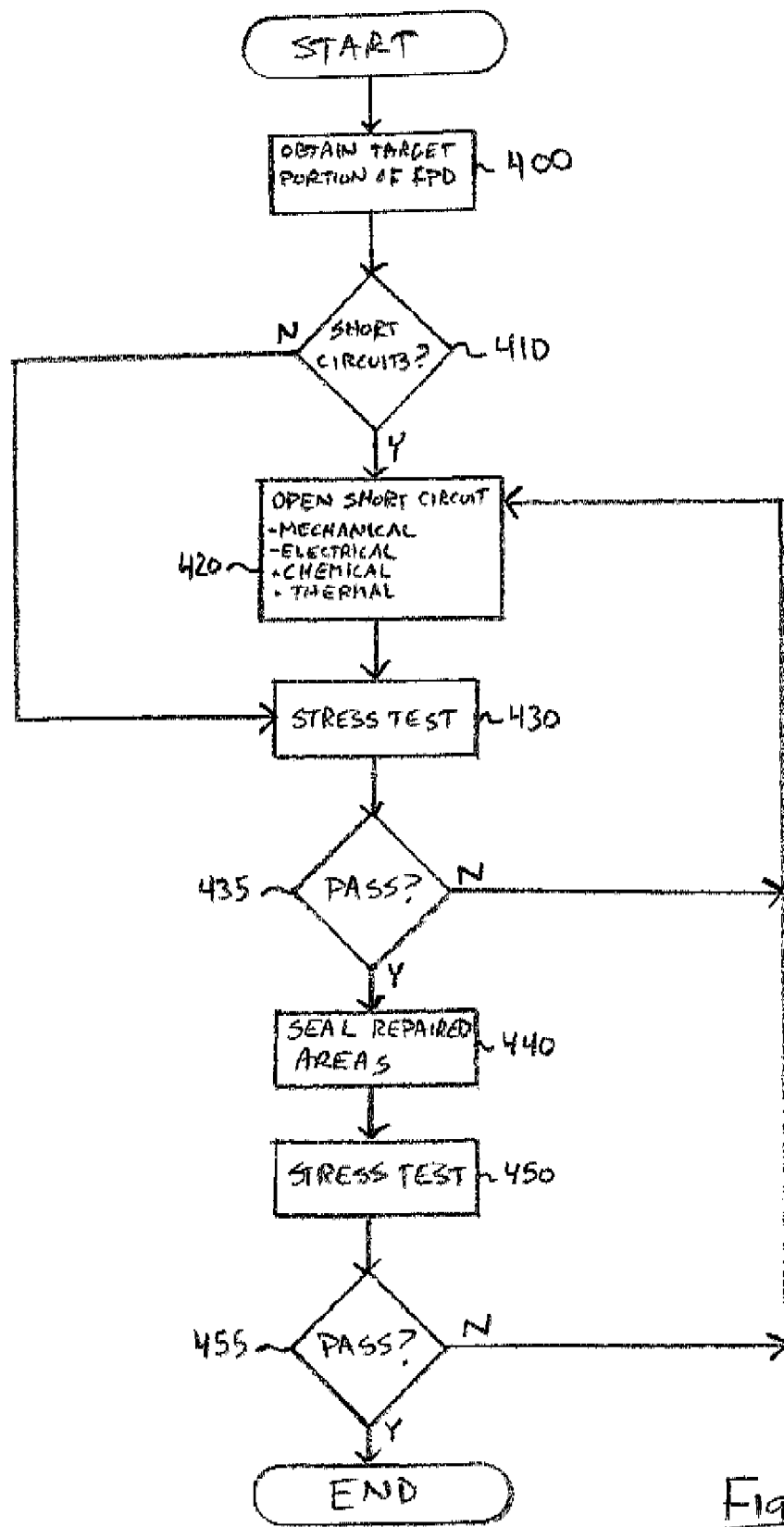
FIG. 4 is a flow diagram showing a method of repairing shorted lines in a target portion of a resized FPD, in accordance with the present invention.

Turning to FIG. 4, a flow diagram is shown of a method of repairing shorted lines in a target portion (5) of a resized FPD, in accordance with the present invention. The method is best performed while the FPD is displaying an image, so the effectiveness of the method can be seen at each step along the way. The method begins at step 400 by obtaining a target portion (5) of a resized FPD. This typically occurs as part of the overall resizing process, i.e., by separating a FPD into a target portion (5) and a waste portion (not shown). But the source of the target portion (5) is not significant, such that this step may include simply being given the target portion (5) which may have been created by someone else doing a resizing operation. The target portion (5) of the FPD at this point typically would be operational.

Once the target portion (5) is obtained, short circuits are identified at step 410. Identification of a short circuit could be accomplished by electrically exciting the display to show an image on image area (40). The short(s) will exhibit a line of nonresponsive pixels, seen symbolically as x's (50) in FIG. 2 and FIG. 3$a$. The nonresponsive pixels will not actually appear as x's, but rather as pixels in the image display area (40) not responding to the image commanded. The location of the short can be found by observing the intersections of the display image line of non-responding pixels (50) and the resized cut edge (55). A failed line of pixels (50) may fade in and out as the electrical current heats the point of contact and burns open the short. The length of the line of affected pixels (50) depends, in part, of the conductivity of the short.

If a short circuit has been identified at step 410, the method proceeds to step 420 at which the short is repaired. Here, the repair may be by applying 1) a mechanical force to remove material to expose the short at a minimum or open the short; 2) a high voltage to the electrical conductive materials associated with the short to fuse open the short; 3) a chemical etchant to etch away material constituting the short; 4) a thermal effect to burn open the short; 5) other means to open the short such as re-cutting the panel to remove the portion of the panel with the short; or any combination of the aforementioned, sequentially and/or substantially simultaneously. Each such repair is performed in a manner sufficient to open the short circuit to cause the image to be complete and sufficiently to ensure that the short does not reoccur.

If no short circuits are identified at step 410 (or after one or more have been identified, and then repaired at step 420), the method proceeds to step 430 at which optionally the display is stress tested for further reliability, and then if applicable to step 440 at which the exposed area (65) of the repaired short is resealed. Step 420 may also be performed to a cut edge (55) that has already been resealed with resizing seal (45) to ruggedize the resizing seal (45), even if image defects are not exhibited initially. For example, the resizing seal (45) may be scrubbed with a chemical-etchant-impregnated material such as a sanding block wetted with an acidic etchant in a manner sufficient to remove exposed electrodes from the resizing seal, and to stress the resizing seal (45). The sanding block may then be used to sand the full length of the resealed edge of the resized display three or four times with moderate pressure. The moderate pressure is sufficient to remove a portion of the sealant with each stroke. Also, the resizing seal (45) can be stress tested, and exposed electrodes removed, by simply rubbing the resizing seal (45) with a chemical etchant. Exposed electrodes should be removed because they could cause a short circuit at some later time in the FPD. This can be done using a cotton swab wet with the etchant agent. The seal line may be further stressed by rubbing it with a metal foil while displaying an image on the display, to see if the symptoms of a short occur. If there are exposed electrodes left on the resizing seal (45), the metal foil will short them during contact, and thus cause pixel failures. In that case, further etching should be done to better ruggedize the seal, and if necessary the resizing seal (45) could be replenished at the affected area. The seal line may be further stressed while being cleaned with wet tissue with alcohol and water.

Stressing the display can be accomplished in many ways, including but not limited to rubbing the resized edge (55) with a wet and dry cotton swab or glass rod or wooded stick, rubbing the resized edge with metal conductive foil, flexing the target panels (20), and/or environmental cycling the LCD in a chamber in temperature and humidity over the required operating range and storage envelope. Step 440 may be applicable, for example, if the resizing seal (45) had already been applied to the cut edge (55) prior to arriving at step 420, and at step 420 the resizing seal (45) was disturbed. This situation is seen in FIG. 3$b$. Additional stress testing may occur at step 450, after the resealing step at 440. The seal may be stressed by flexing, for example, to cause near shorts to occur thus exposing weak points that may be shorted during the normal handling, usage and environmental variations that the display will be exposed to during its operational life.

FIG. 4 shows this process occurring once for all short circuits in parallel, but the process may be performed on a single short at a time. During stress testing at step 430, if the stress testing fails (i.e., one or more shorts are identified) as indicated by the "N" path at decision 435, the process may return back to step 420 to repair the short(s) identified as part of the stress testing. During stress testing at step 450, if the stress testing fails as indicated by the "N" path at decision 455, the process may likewise return back to step 420 to repair the short(s) identified as part of the stress testing. Shorts typically do not recur if they pass a stress test. For further assurance the short will not reappear and cause a pixel image failure symptom, or a new short will not appear and cause a pixel image failure, any resizing seal (45) removed is replenished by applying a protective material (60) after removal of the short, as shown in FIG. 3*c* and at step 440 of FIG. 4.

As previously stated, any exposed area (65) of the resizing seal (45) exposed by the process should be covered to protect and prevent a recurrence of the short and insure the integrity of the seal (45) on the target portion (5). If the exposed area (65) is not covered, shorts may be induced by later disturbances such as physically rubbing the repaired area, or contamination with conductive materials. Further, the original display seal (25) itself may otherwise be compromised and need to be reconstituted. Also as previously stated, additional (or first-time) stress testing may occur after step 440. The stress test should include the entire cut edge even if no symptoms of shorts are exhibited at least once in the process.

Before or after the resizing seal (45) is replenished with protective material (60), it can be stress tested by rubbing the seal bead (45) with a wet cotton swab and/or a dry cotton swab (such as a Q-TIP swab) three or more times and a metal foil three or more times. A suitable wetting agent is isopropyl alcohol. A suitable metal foil is aluminum foil. Any marginal situation will be flexed, shorted or made conductive by the presence of an applicator's wetting agent and by rubbing motion pressure to apply the agent. The symptoms of intermittent shorts, if any, would then occur, thus allowing them to be identified. The intermittent shorts may then be eliminated by the methods described herein. This sequence should be repeated until the intermittent shorts do not recur. Marginal shorts could be readdressed by the same methods and retested and re-stressed until all symptoms of shorts are permanently removed. The stress test may also include environmental testing by, for example, cycling the panel thermally and with humidity. Such a stress test would be done if the situation warranted a high degree of confidence that shorts would not reoccur. Further, the panel could be flexed along the cut edge (55) to induce slight motion in the internal aspects of the seal. If intermittent shorts should occur, then step 420 could be repeated to achieve further separation of the shorting elements. The repair process at step 420 will now be described in more detail.

At step 420, an example of mechanical force to open a short circuit is to mechanically remove material at the cut edge (55) in the vicinity of the short as exhibited by the failed line of pixels (50) in the image area (40) of the target portion (5). If the short is identified by stress testing after the resizing seal (45) is applied, then in most cases the failed line (50) can be fixed by simply scratching the surface of the resizing seal bead (45) with a sharp instrument. To remove more severe shorts, the resizing seal bead (45) may be scraped away and, in the most-severe cases, the substrate (20) may need to be removed to reach and open the short. When removing one short, another short may be precipitated as exhibited by the image. The mechanical action may be repeated until all of the failed lines of pixels are restored if possible.

A specific mechanical way to open a short circuit in a target portion (5) of a resized LCD is by grinding down the resizing seal bead (45) with a high-speed grinder right at the point where the failed line of pixels (50) intercepts the cut edge (55) of the target portion (5). A DREMEL tool with a cutting or grinding blade works well for this function. The blade is held perpendicular to the resizing seal bead (45) at the point to be repaired. While the DREMEL tool is running at high speed, the surface of the bead (45) is lightly contacted. Typically the short is removed in an instant with a small penetration into the bead (45). For more difficult shorts, as shown in FIG. 3*b*, the penetration into the bead (45) is deeper based upon the effect seen in the displayed image. In difficult cases the grinding action may penetrate into the glass substrate (20) before the short is extinguished and the repair is completed. In more severe cases, the short cannot be removed by mechanical means. While removing one short by the mechanical means another short may occur.

There is a high probability that the short will return if only mechanical means are used as is the state of the art. The electrical, chemical, thermal, and/or other methods should thus be used alone, or in combination with each other and/or mechanical means, to achieve greater assurance that the short is removed and will not return.

An example of using electrical means is to apply an excess electrical voltage to the suspect electrodes (30). Since the shorts typically have a higher resistivity than the conductor lines, when a current limited high voltage (a.c. or d.c.) up to ten times the normal voltage is applied between the suspect lines (30) and/or between the lines (30) and the ground plane (35) as applicable, the shorts open like a fuse in an electrical circuit. The conductive metals turn to oxides when fused open and are instantly non-conductors. The electrical fusing process can be used without any other adjunct action such as mechanical or chemical.

An example of using a chemical means is to apply an etching chemical such as hydrochloric acid mixed approximately three to one with nitric acid. In some cases, even a small amount of citrus juice such as grapefruit juice may be sufficient. A preferred method is to first open the sealant at the location of the short mechanically and then dab the acid along the cut edge (55) of the target portion (5) at the point of the short. The short may disappear with the mechanical action, but the acid etch will cause the shorting metals to be separated further. Since the conductive lines (30) are typically made of thin film metals such as aluminum, molybdenum, etc., the conductor lines (30) can be etched back from the cut substrate edge (55) to the point where they are no longer in contact with each other or other conductors in the immediate area. This may be done before the target portion (5) is resealed at step 440, because after resealing, the chemical would have to then penetrate the protective material (60) if applicable, and the resizing seal (45), unless the short extended beyond them. The chemical may be applied by dabbing with a glass rod wetted with the acid or a wooden stick wetted with the acid. The acid should be washed away after a about a minute with a water rinse, by for example, using a cotton swab followed with an isopropyl alcohol cleaning. The short attended to by this series of operations should be completely resolved and this short is most likely ready to be repaired in step 440.

The most effective method using the chemical method is to apply it simultaneously while sanding the seal mechanically. As the mechanical action opens the short or potential short area, the chemical etches the electrodes further than can be achieved by simple mechanical means. This dual action gives an increased margin of separation of the electrodes. Once the electrode is exposed by the mechanical action it is immediately etched away deep into the seal material that directly minimizes the degree of mechanical action needed. The combination of mechanical abrasion and chemical etching is more effective than either one alone or in sequence.

An example of using thermal means is to heat the local area of the short with a soldering iron or laser beam to thermally melt the electrodes within the adhesive and/or glass until the short symptoms are removed. The method of opening electrical lines by a laser beam is well-known in the FPD industry. The thermal method may be preferred in situations wherein the short is in between the substrates (20).

As previously mentioned, multiple forces may be applied substantially simultaneously at step 420, such as: mechanical and electrical; mechanical and chemical; mechanical and thermal; mechanical, electrical and chemical; mechanical, electrical and thermal; mechanical, chemical and thermal; mechanical, electrical, chemical, and thermal. An example of using mechanical and chemical forces substantially simultaneously will now be described.

At step 420, wet an abrasive sanding block of grit approximately 220 with HCl and $HNO_4$ (aqua regia) diluted approximately 4:1 with water. Then scrub the surface of the resized seal bead three or more times. Where a "line-out" (50) exists, scrub the seal edge with the sanding block using moderate hand pressure until the line is restored. A light touch with a DREMEL grinding tool or razor blade may be used if necessary to restore the "line-out." Let the LCD stand for a few seconds to a minute to allow time for the acid to etch away exposed conductors. This sequence may be used when there is no initial short to insure that any undesirable electrodes are removed.

Then for the first stress test at step 430, rub the seal with aluminum foil to stress the seal. Rub the seal with the aluminum foil at least three times using moderate finger pressure. Clean the seal with a tissue wetted with about 91% isopropyl alcohol until the seal is cleansed of any aluminum oxide and other byproducts from the acid treatment. The aluminum oxide stains the tissue black. It may take several rubbings using moderate finger pressure to remove the black aluminum oxide. When the tissue is finally clear of any discoloration after rubbing the seal, clean again with a new clean tissue wetted with isopropyl alcohol using moderate finger pressure. If any "line-out" still appears or reappears, repeat the process of repair (420) and stress test (430) at the area of interest. If the seal is diminished from the application of this method, it may need to be replenished with protective material (60). The replenished area of the seal may require further stress testing and repair.

Figure 3A:
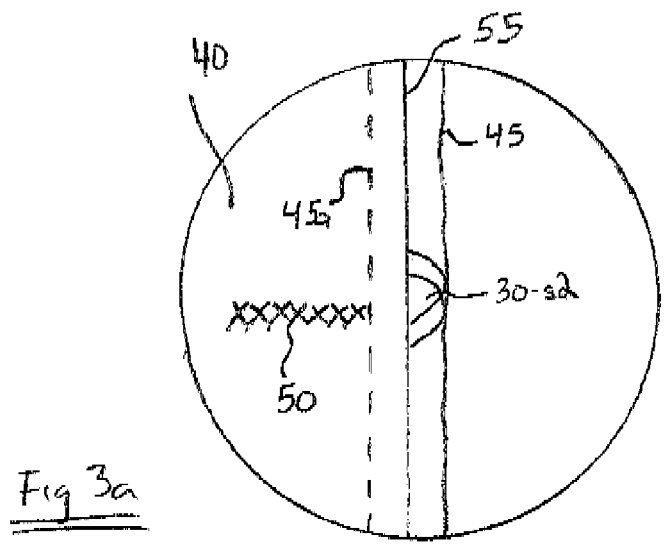
FIG. 3 is a series of close-ups showing: a) the conductor line (30-s2) shorted to the ground plane (35) as seen in FIG. 2; b) the shorted line after being opened; and c) the opened line after being resealed or covered with a dielectric (60). An example of the seal being penetrated and or substrate material being removed is not shown for simplicity.
Figure 3B:
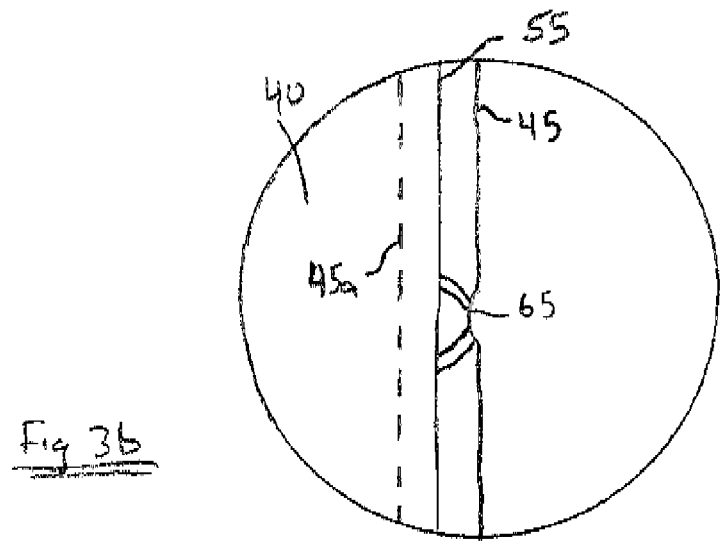
Figure 3C:
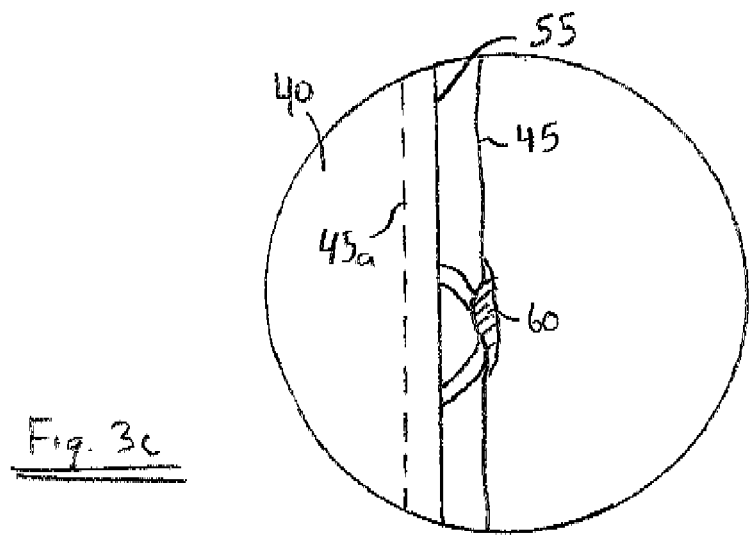

Turning now to FIG. 3, there is shown a series of close-ups to help understand the methods described herein. FIG. 3a shows the conductor line (30-s2) shorted to the ground plane (35) as seen in FIG. 2, and within the resizing seal bead (45). FIG. 3b shows the shorted line (30-s2) of FIG. 3a after being open using methods described herein. For example, a mechanical force could have been applied to cut through the resizing seal bead (45) and the conductor (30-s2). Or the mechanical force could have been used to cut only partially through the resizing seal bead (45), or through the resizing seal bead (45) only, or through the resizing seal bead (45) and only partially through the conductor (30-s2). In these later cases, the short could have been opened after the initial mechanical force by using electrical, chemical, and/or thermal techniques described herein. FIG. 3c shows the opened short line (30-s2) with the resizing seal bead (45) replenished using a protective material (60) to cover the area adjacent the repaired short circuit (30-s2). Protective material (60) may be the same as sealant used to seal the cut edge (55), during the original resizing process, or it may be another dielectric.

The criteria for success in the process is that the symptoms of a failed line of pixels (50) in the image caused by a short at the cut edge (55) do not reappear permanently or intermittently (and that symptoms of no other failed line of pixels appear) during a stress test at the level that the display will see environmentally or mechanically during its operation.

What is claimed is:

1. A method of repairing a short circuit in a resized flat panel display, comprising:
   obtaining a target portion of a resized flat panel display;
   identifying a short circuit in the target portion of the resized flat panel display, and a corresponding failed line of pixels on an image area of the target portion;
   applying a mechanical force to the short circuit in a manner sufficient to open the short circuit, wherein the failed line of pixels disappears; and
   applying an additional force to the opened short circuit, said additional force being selected from the group consisting of an electrical force, a chemical force, and a thermal force.

2. The method of claim 1, further comprising stress testing the opened short circuit.

3. The method of claim 2, wherein the stress testing comprises rubbing the opened short circuit with a wet applicator, and confirming a failed line of pixels does not appear during said rubbing.

4. The method of claim 2, further comprising applying a protective material to an area adjacent the opened short circuit.

5. The method of claim 1, further comprising applying a protective material to an area adjacent the opened short circuit.

6. The method of claim 5, wherein the protective material is a dielectric sealant.

7. The method of claim 5, further comprising stress testing the opened short circuit after applying the protective material, and verifying a failed line of pixels does not reappear.

8. The method of claim 1, wherein the additional force is a chemical force.

9. The method of claim 8, wherein the mechanical force and the chemical force are applied to the short circuit substantially simultaneously.

10. The method of claim 1, wherein the additional force is an electrical force.

11. The method of claim 1, wherein the additional force is a thermal force.

12. The method of claim 1, further comprising applying a second additional force to the opened short circuit, said second additional force being different from the additional force and being selected from the group consisting of an electrical force, a chemical force, and a thermal force.

13. The method of claim 1, wherein the flat panel display is a liquid crystal display.

14. A method of repairing a short circuit in a resized flat panel display, comprising:
   obtaining a target portion of a resized flat panel display;
   identifying a short circuit in the target portion of the resized flat panel display, and a corresponding failed line of pixels on an image area of the target portion;
   simultaneously applying a mechanical force and a chemical force to the short circuit in a manner sufficient to open the short circuit, wherein the failed line of pixels disappears;
   stress testing the opened short circuit;
   verifying a failed line of pixels does not appear during the stress testing; and applying a protective material to an area adjacent the opened short circuit, after the verifying step.

15. The method of claim 14, further comprising stress testing the opened short circuit after applying the protective material.

16. The method of claim 14, further comprising applying an additional force to the opened short circuit, said additional force being selected from the group consisting of an electrical force and a thermal force.

17. The method of claim 16, wherein the additional force is an electrical force.

18. The method of claim 16, wherein the additional force is a thermal force.

19. The method of claim 14, wherein the stress testing comprises flexing panels of the flat panel display.

20. The method of claim 14, wherein the stress testing comprises rubbing the opened short circuit with a wet applicator.

21. The method of claim 14, further comprising the following steps, all performed before applying the protective material to the area adjacent the opened short circuit:
   identifying a second short circuit in the target portion, and a corresponding second failed line of pixels on the image area of the target portion;
   simultaneously applying a mechanical force and a chemical force to the second short circuit in a manner sufficient to open the second short circuit, wherein the second failed line of pixels disappears;
   stress testing the second opened short circuit; and
   verifying a failed line of pixels does not reappear during the stress testing of the second opened short circuit.

22. A method of repairing a short circuit in a resized flat panel display, comprising:
   obtaining a target portion of a resized flat panel display;
   identifying a short circuit in the target portion of the resized flat panel display, and a corresponding failed line of pixels on an image area of the target portion;
   applying a mechanical force to the short circuit in a manner sufficient to open the short circuit, wherein the failed line of pixels disappears; and
   applying a chemical etchant to the short circuit in a manner sufficient to open an existing short circuit.

23. The method of claim 22, wherein the chemical etchant opens the existing short circuit by increasing a separation distance between circuit electrodes in proximity of the short circuit.

24. The method of claim 22, wherein the short circuit is located on a cut edge of the resized flat panel display, and wherein the cut edge is sealed with a resizing seal before the chemical etchant is applied.

25. The method of claim 22, further comprising applying a protective material to a portion of the cut edge.

26. The method of claim 25, further comprising stress testing the opened short circuit after applying the protective material, and verifying a failed line of pixels does not reappear.

27. A method of preventing a short circuit in a resized flat panel display, comprising:
   obtaining a target portion of a resized flat panel display comprising a cut edge;
   applying a mechanical force to the cut edge to open any short circuits along the cut edge; and
   applying an additional force to the further ensure any short circuit are opened along the cut edge, said additional force being selected from the group consisting of an electrical force, a chemical force, and a thermal force.

28. The method of claim 27, further comprising applying a protective material to the cut edge.

29. The method of claim 28, wherein the protective material is a dielectric sealant.

30. The method of claim 28, further comprising stress testing the target portion after applying the protective material, and verifying a failed line of pixels does not appear on the target portion.

31. The method of claim 27, wherein the additional force is a chemical force.

32. The method of claim 31, wherein the mechanical force and the chemical force are applied to the short circuit substantially simultaneously.

* * * * *